(12) United States Patent
Song (10) Patent No.: US 8,587,016 B2
(45) Date of Patent: Nov. 19, 2013

(54) LIGHT EMITTING DEVICE PACKAGE HAVING LIGHT EMITTING DEVICE ON INCLINED SIDE SURFACE AND LIGHTING SYSTEM INCLUDING THE SAME

(75) Inventor: Yong Seon Song, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 657 days.

(21) Appl. No.: 12/709,132

(22) Filed: Feb. 19, 2010

(65) Prior Publication Data

US 2010/0213497 A1 Aug. 26, 2010

(30) Foreign Application Priority Data

Feb. 20, 2009 (KR) .................. 10-2009-0014256

(51) Int. Cl.
*H01L 33/00* (2010.01)
*H01L 23/34* (2006.01)
*F21V 7/00* (2006.01)
*B60Q 1/00* (2006.01)
*H01J 1/02* (2006.01)
*H01J 7/24* (2006.01)
*H01J 61/52* (2006.01)
*H01J 1/62* (2006.01)
*H01J 63/04* (2006.01)
*H01J 17/16* (2012.01)
*H01J 61/35* (2006.01)

(52) U.S. Cl.
USPC ............ 257/99; 257/98; 257/713; 257/719; 257/720; 257/E23.011; 313/46; 313/113; 313/485; 313/498; 313/635; 362/84; 362/308; 362/309; 362/547

(58) Field of Classification Search
USPC ............................................. 349/67
See application file for complete search history.

(56) References Cited

U.S. PATENT DOCUMENTS

| | | | |
|---|---|---|---|
| 6,635,987 B1 | 10/2003 | Wojnarowski et al. | |
| 7,355,209 B2 * | 4/2008 | Tsai et al. | 257/79 |
| 8,269,248 B2 * | 9/2012 | Thompson | 257/99 |
| 2006/0103012 A1 * | 5/2006 | Chin | 257/712 |
| 2006/0214179 A1 * | 9/2006 | Cao | 257/99 |
| 2007/0018190 A1 | 1/2007 | Kim et al. | |
| 2007/0195524 A1 | 8/2007 | Seo et al. | |
| 2007/0291482 A1 * | 12/2007 | Baroky et al. | 362/227 |
| 2008/0123021 A1 | 5/2008 | Park et al. | |
| 2008/0165539 A1 | 7/2008 | Hsu et al. | |
| 2009/0026472 A1 | 1/2009 | Yasuda et al. | |

FOREIGN PATENT DOCUMENTS

| | | |
|---|---|---|
| JP | 2001-345483 A | 12/2001 |
| JP | 2007-227373 A | 9/2007 |
| KR | 10-2007-0083332 A | 8/2007 |
| KR | 20-0444244 Y1 | 4/2009 |

* cited by examiner

*Primary Examiner* — Michael Jung
(74) *Attorney, Agent, or Firm* — Birch, Stewart, Kolasch & Birch, LLP (57) ABSTRACT

Provided are a light emitting device package and a lighting system comprising the same. The light emitting device package comprises a package body having an inclined side surface and a light emitting device on the inclined side surface of the package body.

20 Claims, 7 Drawing Sheets

LIGHT EMITTING DEVICE PACKAGE HAVING LIGHT EMITTING DEVICE ON INCLINED SIDE SURFACE AND LIGHTING SYSTEM INCLUDING THE SAME

CROSS-REFERENCE TO RELATED APPLICATIONS

The present application claims priority under 35 U.S.C. §119 to Korean Patent Application No. 10-2009-0014256, filed on Feb. 20, 2009, which is hereby incorporated by reference in its entirety.

BACKGROUND

Embodiments relate to a light emitting device package and a lighting system including the same.

Nitride semiconductors are attracting much attention for the fields of optical devices and high-power electronic devices because of their high thermal stability and wide band gap energy. In particular, blue LEDs, green LEDs, and UV LEDs that use nitride semiconductors have been commercialized and are widely used.

A light emitting diode (LED) may constitute a light emitting source by use of compound semiconductor materials such as GaAs-based materials, AlGaAs-based materials, GaN-based materials, InGaN-based materials and InGaAlP-based materials.

Such an LED is packaged and thereby is being used as a light emitting device for emitting various color lights. The light emitting device is being used as a light source in various fields, for example, lighting display devices, character display devices and image display devices.

However, in a related art light emitting device package, a radiation angle of light emitted from a package body is limited to reduce light extraction efficiency.

SUMMARY

Embodiments provide a light emitting device package having improved light extraction efficiency and a lighting system including the same.

In one embodiment, a light emitting device package comprises: a package body having an inclined side surface; and a light emitting device on the inclined side surface of the package body.

In another embodiment, a lighting system comprises: a light emitting module comprising a light emitting device package including a light emitting device disposed on an inclined side surface of a package body.

The details of one or more embodiments are set forth in the accompanying drawings and the description below. Other features will be apparent from the description and drawings, and from the claims.

BRIEF DESCRIPTION OF THE DRAWINGS

FIGS. 2 to 6A are sectional views illustrating a process of manufacturing a light emitting device according to an embodiment.

DETAILED DESCRIPTION OF THE EMBODIMENTS

Hereinafter, a light emitting device according to an embodiment and a lighting system including the same will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under layer, and one or more intervening layers may also be present. In addition, it will be also be understood that when a layer is referred to as being 'between' two layers, it can be the only layer between the two layers, or one or more intervening layers may also be present.

Embodiment

Figure 1:
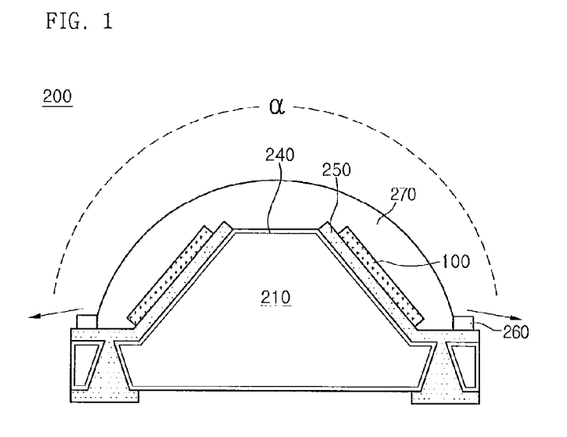
FIG. 1 is a sectional view of a light emitting device package according to an embodiment.

FIG. 1 is a sectional view of a light emitting device package 200 according to an embodiment.

A light emitting device package 200 according to an embodiment may include a package body 210 in which both side surfaces of an upper portion thereof are inclined and light emitting devices 100 disposed on both side surfaces of the package body 210.

The package body 210 in which both side surfaces of the upper portion thereof are inclined has a lower width greater than an upper width thereof to widen a radiation angle of light, thereby improving light reflectance.

Also, the package body 210 may be inclined so that a width thereof gradually increases toward a downward direction. For example, when the package body 210 is a <100> silicon wafer, the inclined surface of the package body 210 may be inclined as an angle of about 54.7° with respect to a <111> crystal plane. Thus, the package body 210 may have a width gradually increasing toward a downward direction.

The package body 210 may have an upper portion having a pyramid shape in which a top portion is cut off.

Also, in an embodiment, the package body 210 may include an electrostatic discharge (ESD) protection device at the inside of the upper portion thereof. For example, the to miniaturize a size of the light emitting device package and protect the light emitting device when the electrostatic discharge occurs.

Package body 210 may include a Zener diode (now shown) at the inside of the upper portion thereof. The Zener diode may be electrically connected to the plurality of light emitting devices 100 to protect the light emitting devices 100 when a electrostatic discharge occurs.

The Zener diode may miniaturize a size of the light emitting device package by being formed in the package body 210, and the Zener diode may not screen the light emitted by the LED for being formed in the package body 210.

The light emitting device package according to an embodiment may include a sealing material 270 surrounding the package body 210 and the light emitting devices 100. The sealing material 270 may have a hemispherical shape, but is not limited thereto. The sealing material 270 may contain a phosphor (not shown).

In an embodiment, a barrier 260 is formed when the sealing material 270 is formed. The barrier 260 may help the formation of the sealing material 270 as well as prevent a lifting phenomenon of the sealing material 270 from occurring on a metal layer 250. The barrier 260 may include an oxide layer or a nitride layer, but is not limited thereto.

Figure 6A:
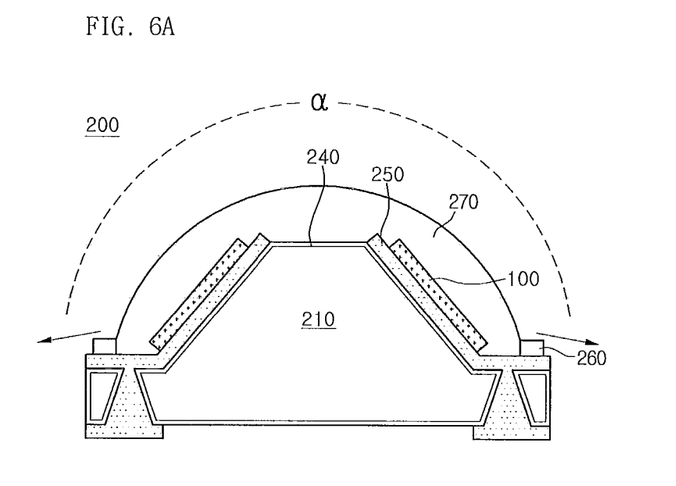
Figure 6B:
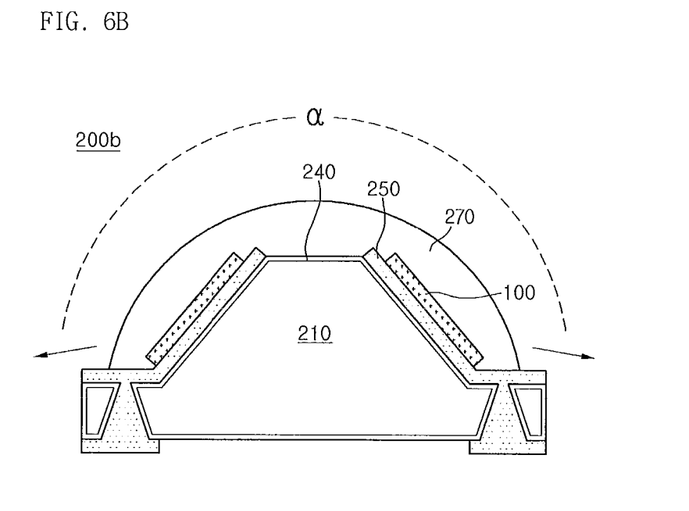
FIGS. 6B, 6C, 6D are sectional views of a light emitting device package according to other embodiments.
Figure 6C:
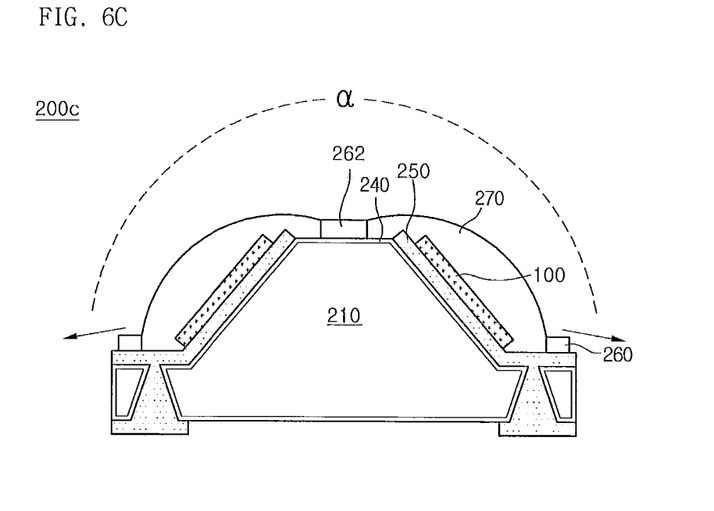
Figure 6D:
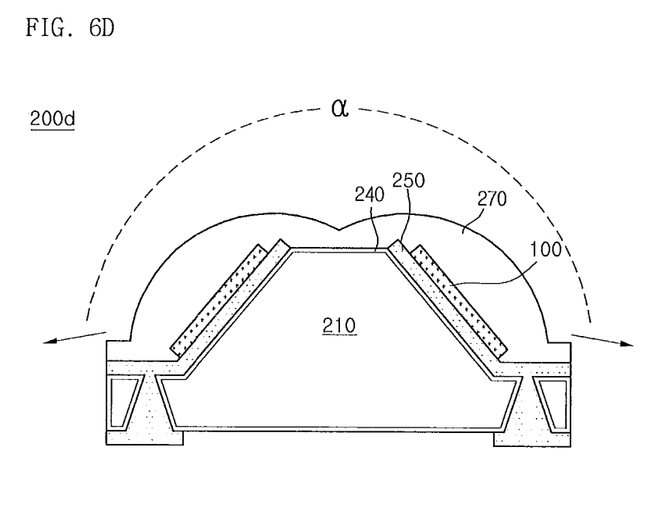

FIGS. 6B, 6C, 6D are sectional views of a light emitting device package according to other embodiments.

As the FIG. 6B, in a light emitting device package 200b according to another embodiment, a barrier may not be formed when the sealing material 270 is formed. Or the barrier 260 may be removed formed after the sealing material 270 is formed.

Also, as the FIG. 6C, in a light emitting device package 200c according to further another embodiment, the sealing material 270 may be formed on the light emitting device 100 respectively. A second barrier 262 may be formed on the package body 210 when the sealing material 270 is formed, but is not limited thereto.

As the FIG. 6D, in a light emitting device package 200c according to further another embodiment, a second barrier may not be formed when the sealing material 270 is formed. And the sealing material 270 may be formed by transfer molding.

In the light emitting device package according to an embodiment, since the package body 210 may have the inclined surface on both side surfaces of the upper portion thereof, the radiation angle of the light may be widened to significantly improve the light reflectance.

Hereinafter, a method of manufacturing a light emitting device according to an embodiment will be described with reference to FIGS. 2 to 6A. FIG. 6A is a top view of a light emitting device package according to an embodiment.

Figure 2:
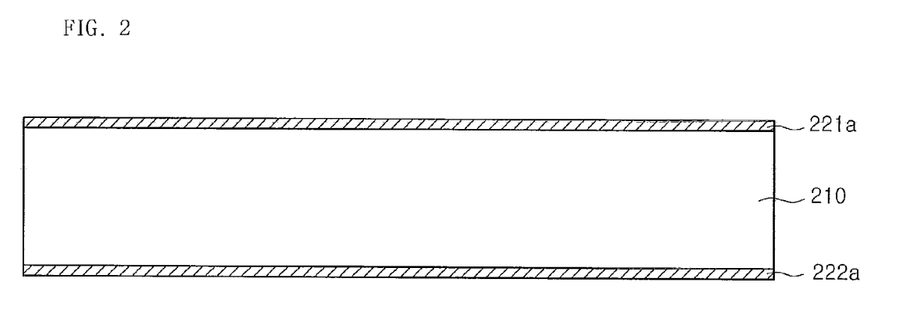

As shown in FIG. 2, a package body 210 is prepared. A first mask pattern material 221a and a second mask pattern material 222a are formed on top and bottom surfaces of the package body 210, respectively.

The package body 210 may be formed of a silicon material, for example, may be a silicon-based wafer level package (WLP). The package body 210 may include a frame having a polyhedral shape, for example rectangular parallelepiped shape, but is not limited thereto.

The first mask pattern material 221a and the second mask pattern material 222a may be a nitride layer, for example, a silicon nitride ($Si_xN_y$) layer, but is not limited thereto.

Figure 3:
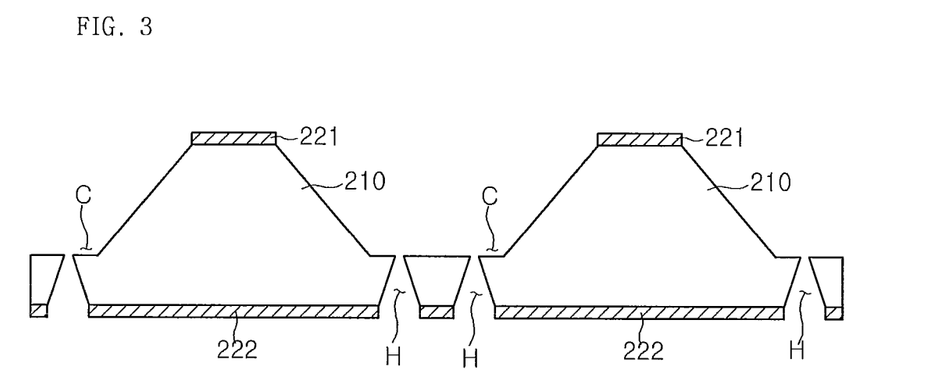

As shown in FIG. 3, a cavity C is formed in the package body 210. The cavity formation process and the package body formation process may be performed at the same time, but is not limited thereto.

The cavity C may have a cup shape or a concave vessel shape. An inner surface of the cavity C may be perpendicular to or inclined with respect to a bottom surface thereof. The cavity C may have a circular, square, polygonal, or oval shape when viewed from an upper side.

As shown in FIG. 3, the both side surfaces of the upper portion of the package body 210 may be inclined.

For example, the package body 210 in which both side surfaces of an upper portion thereof are inclined has a lower width greater than an upper width thereof. Also, the package body 210 may be inclined so that a width thereof gradually increases toward a downward direction. The package body 210 may have an upper portion having a pyramid shape in which a top portion is cut off.

For example, when the package body 210 is a <100> silicon wafer, the inclined surface of the package body 210 may be inclined as an angle of about 54.7° with respect to a <111> crystal plane. Thus, the package body 210 may have a width gradually increasing toward a downward direction.

According to an embodiment, since the package body 210 has the inclined surface on both side surfaces of the upper portion thereof, a radiation angle of light may be widened to significantly improve light reflectance.

For example, the forming of the package body 210 in which both side surfaces of the upper portion thereof are inclined may include forming a first mask pattern 221 covering a central portion of a top surface of the package body 210.

For example, the first mask pattern material 221a is patterned to cover the central portion of the top surface of the package body 210 and expose a remaining region except the central portion. That is, a photoresist pattern (not shown) may be formed on the first mask pattern material 221a. Then, a portion of the first mask pattern material 221a may be etched using the first photoresist pattern as an etch mask to form the first mask pattern 221 exposing a portion of the top surface of the package body 210 except the central portion of the top surface.

At this time, the forming of the package body 210 may include forming a via hole H in a lower portion of the package body 210. That is, the second mask pattern material 222a may be patterned using a second photoresist pattern (not shown) to form a second mask pattern 222 exposing the via hole H.

Thereafter, the package body 210 may be etched using the first mask pattern 221 and the second mask pattern 222 as an etch mask to form the package body 210 in which both side surfaces of the upper portion thereof are inclined and the via hole H.

The package body 210 may be etched using a wet etching process, but is not limited thereto.

At this time, when the package body 210 is a silicon substrate and has a <100> crystal orientation, the etching proceeds along the inclined direction to form the package body 210 having a lower width greater than an upper width thereof as shown in FIG. 3. The package body 210 may be inclined so that the width thereof gradually increases toward a downward direction. The package body 210 may have an upper portion having a pyramid shape in which a top portion is cut off.

In an embodiment, a first etching process may be performed to etch the package body 210, and then a second etching process may be performed to etch the etched package body 210 again to form the inclined package body 210 and the via hole H.

Figure 4:
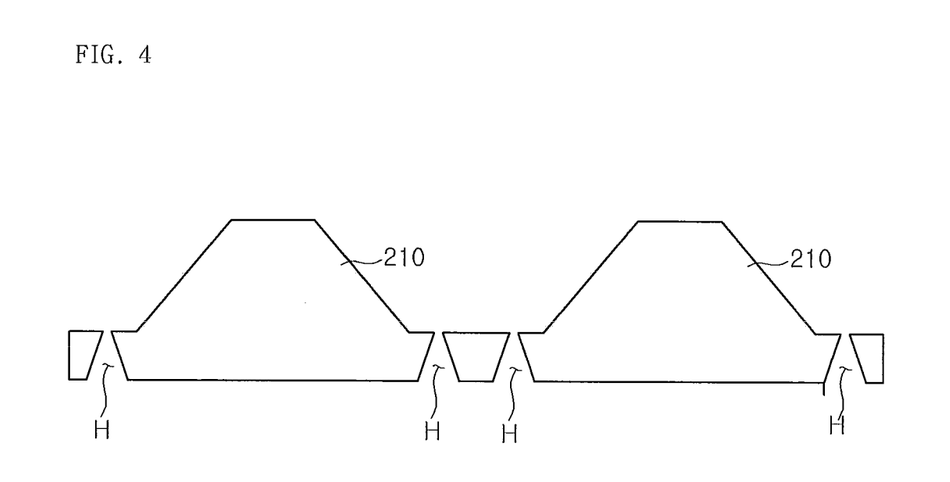

As shown in FIG. 4, the first mask pattern 221 and the second mask pattern 222 may be removed. For example, a wet etching process may be performed to remove the first mask pattern 221 and the second mask pattern 222.

In an embodiment, an ESD protection device may be formed within an upper portion of the package body 210. For example, a Zener diode (now shown) may be formed within the upper portion of the package body 210.

The Zener diode may miniaturize a size of the light emitting device package by being formed in the package body 210, and the Zener diode may not screen a light emitted by the LED for being formed in the package body 210.

Figure 5:
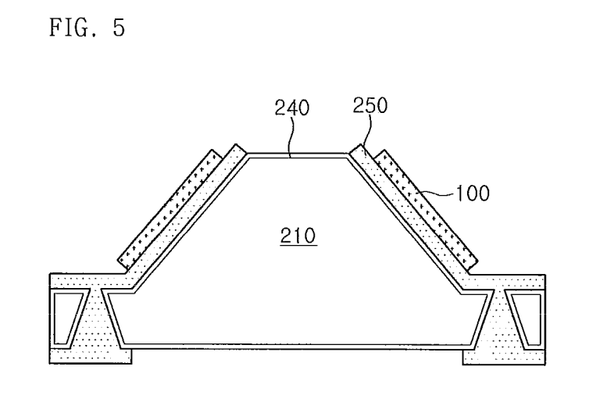

As shown in FIG. 5, a dielectric 240 may be formed on the package body 210, and then, a metal layer 250 may be formed in the via hole and on the respective side surfaces of the package body 210. At this time, the package bodies 210 may be divided into unit of package to perform a dielectric formation process. Alternatively, the dielectric formation process may be performed before the package bodies 210 are divided into unit of package.

According to an embodiment, the metal layer 250 may be formed in the via hole H to effectively emit heat generated in the light emitting device 100.

The dielectric 240 may be formed of one of insulation materials such as silicon oxide, silicon nitride, AlN, and SiC.

The dielectric 240 may electrically isolate the package body 210 from the metal layer 250 (that will be formed later).

The metal layer 250 may be an electrode layer electrically connected to the light emitting device 100 and have a single layer structure or a multi-layered structure.

For example, when the light emitting device 100 is a vertical type light emitting device, the metal layer 250 and the light emitting device 100 may be directly and electrically connected to each other.

The metal layer 250 may be formed of at least one of titanium (Ti), copper (Cu), nickel (Ni), gold (Au), chrome (Cr), tantalum (Ta), platinum (Pt), tin (Sn), silver (Ag), and phosphorus (P), but is not limited thereto.

When the light emitting device 100 is bonded in a flip-chip shape, the light emitting device 100 may be electrically connected to the metal layer 250.

When the light emitting device 100 is a horizontal type light emitting device, the metal layer 250 may not be formed on the side surface of the package body 210.

The metal layer 250 may be formed of a material having high reflectance or a metal material to which a resin material can easily adhere. When the metal layer 250 has the multi-layered structure, a top layer may be formed of at least one of metal materials such as Al, Ag, and APC (Ag+Pd+Cu).

Thereafter, the light emitting device 100 may be disposed on the metal layer 250 formed on the inclined surface of the package body 210. For example, the light emitting device 100 may adhere to the metal layer 250 using an adhesive. The light emitting device 100 may include at least one colored LED chip or UV LED chip, but is not limited thereto.

The light emitting device 100 may be the vertical type light emitting device or the horizontal type light emitting device. For example, when the light emitting device 100 is the horizontal type light emitting device, two wires may be bonded to one light emitting device 100.

When the light emitting device 100 is the vertical type light emitting device, the light emitting device 100 and the metal layer 250 may be electrically connected to each other. At this time, one wire may be bonded to an upper portion of the light emitting device 100. Also, in case of a high performance light emitting device, a plurality of wires may be bonded.

According to an embodiment, since the side surface of the light emitting device 100 is attached to the inclined package body 210, a radiation angel α of the package may be widened to significantly improve light reflectance.

As shown in FIG. 6A, a sealing material 270 surrounding the package body 210 and the light emitting device 100 may be formed. The sealing material 270 may have a hemispherical shape, but is not limited thereto. The sealing material 270 may contain a phosphor (not shown).

In an embodiment, a barrier 260 may be formed when the sealing material 270 is formed. The barrier 260 may help the formation of the sealing material 270 as well as prevent a lifting phenomenon of the sealing material 270 from occurring on the metal layer 250. The barrier 260 may include an oxide layer or a nitride layer, but is not limited thereto.

In the light emitting device package according to an embodiment, the radiation angle of the light in the package body may be widened to significantly improve the light reflectance.

FIGS. 6B, 6C, 6D are sectional views of a light emitting device package according to other embodiments.

As the FIG. 6B, in a light emitting device package 200b according to another embodiment, a barrier may not be formed when the sealing material 270 is formed. Or the barrier 260 may be removed formed after the sealing material 270 is formed.

Also, as the FIG. 6C, in a light emitting device package 200c according to further another embodiment, the sealing material 270 may be formed on the light emitting device 100 respectively. A second barrier 262 may be formed on the package body 210 when the sealing material 270 is formed, but is not limited thereto.

As the FIG. 6D, in a light emitting device package 200c according to further another embodiment, a second barrier may not be formed when the sealing material 270 is formed. And the sealing material 270 may be formed by transfer molding.

The light emitting device package 200 according to an embodiment may be applicable to a lighting system. The lighting system may include a lighting unit illustrated in FIG. 7, a backlight unit illustrated in FIG. 8, traffic lights, a vehicle headlight, and a sign.

Figure 7:
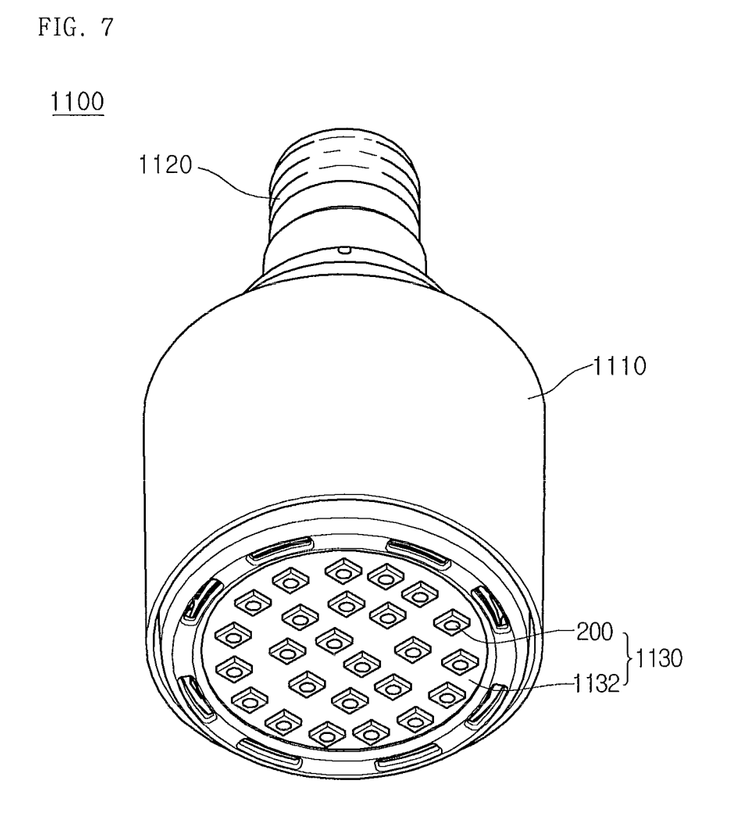
FIG. 7 is a perspective view of a lighting unit according to an embodiment.

FIG. 7 is a perspective view of a lighting unit according to an embodiment.

Referring to FIG. 7, a lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a substrate 1132 and at least one light emitting device package 200 mounted on the substrate 1132.

A circuit pattern may be printed on an insulation material to form the substrate 1132. For example, the substrate 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

At least one light emitting device package 200 may be mounted on the substrate 1132. The light emitting device package 200 may include at least one light emitting diode (LED) 100. The LED 100 may include a colored LED that emits red, green, blue, or white light and an UV LED that emits ultraviolet (UV) light.

The light emitting module 1130 may include a plurality of light emitting device packages 200 to obtain various colors and brightness. For example, a white LED, a red LED, and a green LED may be disposed in combination with each other to secure a high color rendering index (CRI).

The connection terminal 1120 may be electrically connected to the light emitting module 1130 to supply a power. As shown in FIG. 7, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power using an interconnection.

Figure 8:
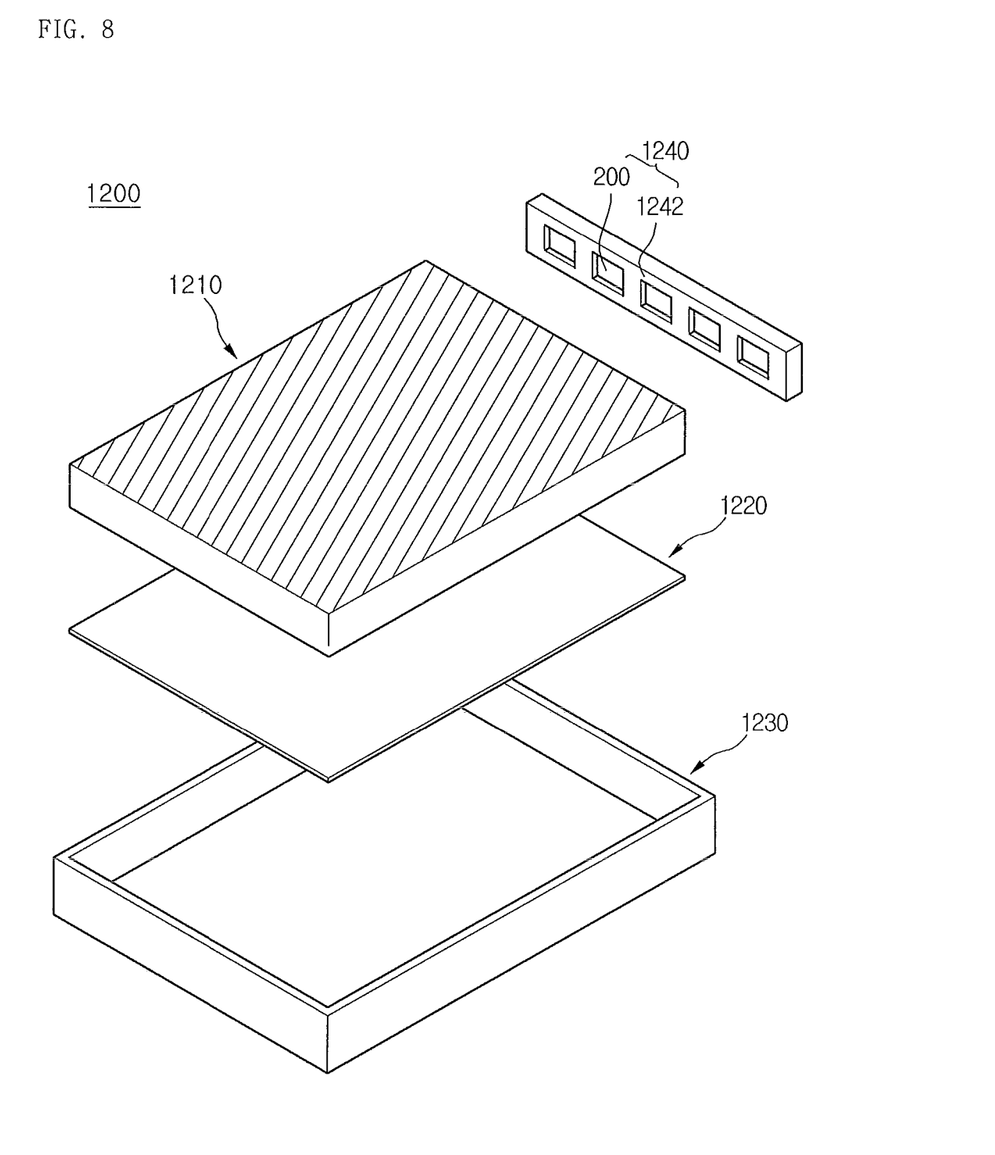
FIG. 8 is a perspective view of a backlight unit according to an embodiment.

FIG. 8 is a perspective view of a backlight unit according to an embodiment.

A backlight unit 1200 according to an embodiment may include a light guide plate 1210, a light emitting module 1240, a reflective member 1220, and a bottom cover 1230, but is not limited thereto. The light emitting module 1240 may contact at least one surface of the light guide plate 1210 to provide light the light guide plate 1210, but is not limited thereto. The reflective member 1220 may be disposed below the light guide plate 1210. The bottom cover 1230 may receive the light guide plate 1210, the light emitting module 1240, and the reflective member 1220.

The light guide plate 1210 may diffuse light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 may provide light to at least one surface of the light guide plate 1210. Thus, the light emitting module 1240 may be used as a light source of a display device including the backlight unit.

The light emitting module 1240 may contact the light guide plate 1210 but is not limited thereto.

In particular, the light emitting module 1240 may include a substrate 1242 and a plurality of light emitting device package 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The plurality light emitting device packages 200 may be mounted on the substrate 1242. Also, a light emitting surface of each of the light emitting device packages 200 may be spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member 1220 may be formed of one of PET, PC, and PVC, but is not limited thereto.

The bottom cover 1230 may store the light guide plate 1210, the light emitting module 1240, and the reflective member 1220. For this, the bottom cover 1230 may have a box shape with an opened upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a package body including an upper portion and a flat surface at a side boundary area of the upper portion, wherein an inclined side surface is formed on a side surface of the upper portion;
a light emitting device on the inclined side surface of the package body;
a via hole through the package body; and
a metal layer comprising an upper metal layer on the inclined side surface of the package body and a lower metal layer in the via hole,
wherein a lower width of the upper portion is greater than an upper width of the upper portion,
wherein the lower metal layer comprises a bottom via portion and an upper via portion, and
wherein a lateral width of the bottom via portion is larger than a lateral width of the upper via portion.

2. The light emitting device package according to claim 1, wherein the package body is inclined so that a width of the package body gradually increases toward a downward direction.

3. The light emitting device package according to claim 1, wherein the upper portion comprises a pyramid shape in which a top portion is cut off.

4. The light emitting device package according to claim 1, wherein both side surfaces of the upper portion of the package body are inclined.

5. The light emitting device package according to claim 1, wherein the package body comprises a silicon substrate.

6. The light emitting device package according to claim 1, comprising a dielectric on the package body.

7. The light emitting device package according to claim 6, wherein the light emitting device is attached to the dielectric disposed on the side surface of the package body.

8. The light emitting device package according to claim 6, wherein the dielectric comprises one of silicon oxide, silicon nitride, AlN, and SiC.

9. The light emitting device package according to claim 6, wherein the metal layer is within the via hole defined in the lower portion of the package body and on the dielectric disposed on the side surface of the package body.

10. The light emitting device package according to claim 9, wherein the light emitting device is attached to the metal layer disposed on the side surface of the package body.

11. The light emitting device package according to claim 9, wherein the metal layer comprises an electrode layer electrically connected to the light emitting device and has a single layer structure or a multi-layered structure.

12. The light emitting device package according to claim 1, wherein the light emitting device comprises a horizontal type light emitting device or a vertical type light emitting device.

13. The light emitting device package according to claim 1, wherein the light emitting device is attached to surround the side surface of the package body.

14. The light emitting device package according to claim 1, comprising a barrier on both sides of the package body and a sealing material disposed inside the barrier to surround the package body and the light emitting device.

15. The light emitting device package according to claim 14, further comprising a second barrier between the sealing material on a top surface of the upper portion.

16. The light emitting device package according to claim 1, wherein the package body comprises a <100> silicon wafer, and
   wherein the inclined surface of the upper portion is inclined at an angle of 54.7° with respect to a <111> crystal plane.

17. The light emitting device package according to claim 1, wherein a lateral width of the lower metal layer gradually increases from the upper via portion to the bottom via portion.

18. The light emitting device package according to claim 1, wherein the lower metal layer in the via hole is disposed below the light emitting device.

19. The light emitting device package according to claim 1, wherein the light emitting device is directly disposed on the upper metal layer.

20. A lighting system comprising:
   a light emitting module comprising the light emitting device package according to claim 1 disposed on an inclined side surface of a package body.

* * * * *